United States Patent [19]

Rode et al.

[11] 4,099,240
[45] Jul. 4, 1978

[54] METHOD AND APPARATUS FOR PROGRAMMABLE AND REMOTE NUMERIC CONTROL AND CALIBRATION OF ELECTRONIC INSTRUMENTATION

[75] Inventors: France Rode, Los Altos; Peter Lindes, Palo Alto; Ralph F. Eschenbach, Los Altos; Zvonko A. Fazarinc, Portola Valley, all of Calif.

[73] Assignee: Hewlett-Packard Company, Palo Alto, Calif.

[21] Appl. No.: 759,308

[22] Filed: Jan. 14, 1977

[51] Int. Cl.$^2$ .......................... G06F 3/14; H01J 29/00
[52] U.S. Cl. ................................. 364/571; 364/607; 340/324 A
[58] Field of Search ................ 235/151.3, 151.31, 151, 235/150, 198; 340/324 A, 324 AD; 444/1; 324/77 R, 77 A, 77 B

[56] References Cited

U.S. PATENT DOCUMENTS

| | | | |
|---|---|---|---|
| 3,539,726 | 11/1970 | Bolie | 179/1 |
| 3,544,894 | 12/1970 | Hartwell et al. | 324/77 |
| 3,548,305 | 12/1970 | Kaufman | 324/77 |
| 3,649,819 | 3/1972 | Waller | 235/151 |
| 3,653,027 | 3/1972 | Scheer | 340/324 |
| 3,836,851 | 9/1974 | Schumann | 324/112 |
| 3,872,461 | 3/1975 | Jarosik | 340/324 AD |
| 3,952,297 | 4/1976 | Stauffer et al. | 235/198 X |

*Primary Examiner*—Edward J. Wise
*Attorney, Agent, or Firm*—F. D. LaRiviere

[57] ABSTRACT

The present invention provides programmable, remote and automatic numeric control and calibration of analog signal measuring and generating apparatus. Digital values for control signals for control of gain, sensitivity, frequency and the like and for calibration are stored and may be easily modified to follow complex control and calibration functions. Conventional controls are replaced by pushbuttons which initiate calculation of digital control signals from controlling the transfer function of variable elements of the apparatus. Conventional meters and dials are replaced by digital readout devices for indicating operational parameters such as amplitudes, sensitivities, frequencies and the like. Digital values for calibration factors and parameter control settings also may be recorded on suitable recording media for use under recurring conditions and environments.

35 Claims, 14 Drawing Figures

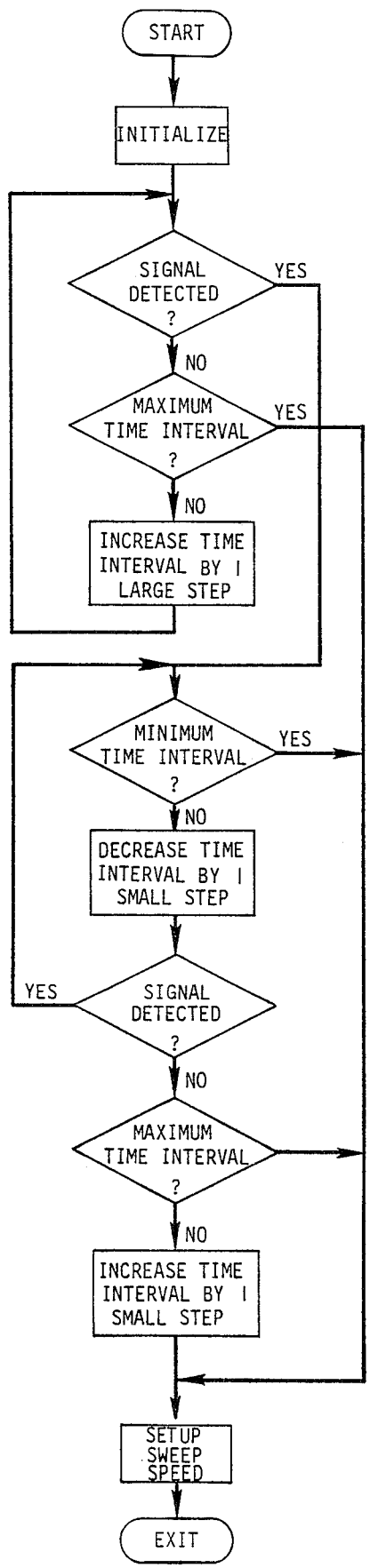

INITIAL CONDITIONS:

COMPARATOR 91 IS SET UP TO DETECT THE DESIRED SIGNAL (REFER TO FIGURE 10)

SET THE TIME INTERVAL OF TIMER 95 TO THE PERIOD OF THE FASTEST SWEEP SPEED. SET DETECTOR 29 TO MODE A.

RESET DETECTOR 29, WAIT TWICE THE TIME INTERVAL, THEN READ DETECTOR 29.

CHECK FOR END OF RANGE.

LARGE CHANGE (FACTOR OF 10) FOR GROSS DETECTION.

SEARCH IN SMALL STEPS (APPROXIMATELY FACTOR OF $\sqrt{2}$) WITHIN A LARGE STEP.

COMPUTE PROPER SWEEP SPEED FROM TIME INTERVAL AND SETUP SWEEP CIRCUITS ACCORDINGLY.

FIGURE 11

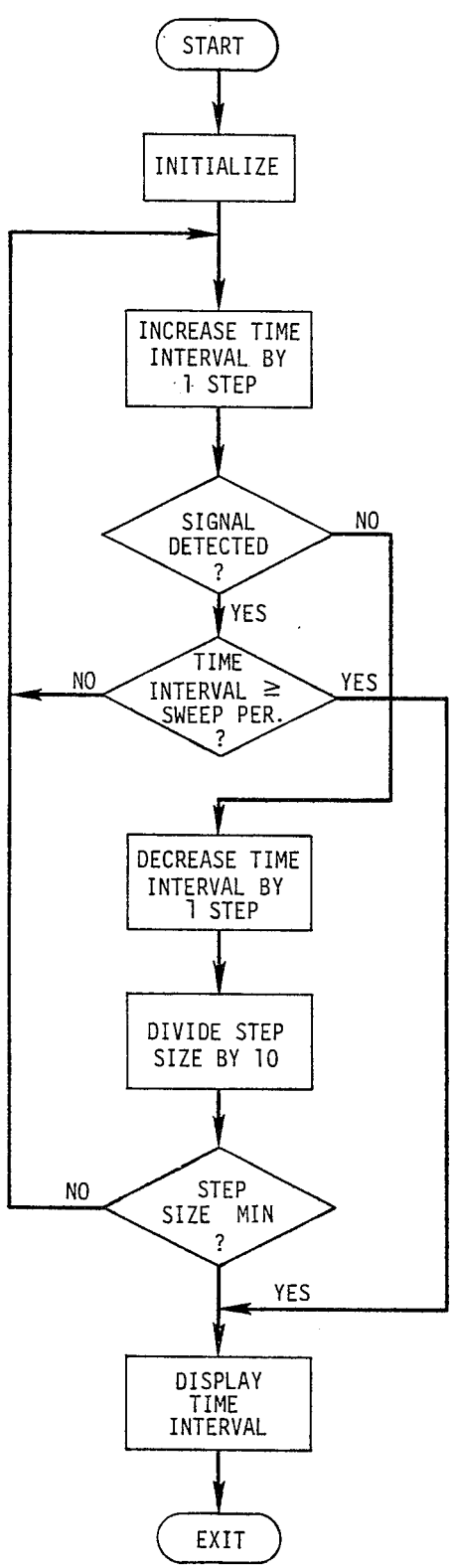

INITIAL CONDITIONS:
COMPARATOR 91 IS SET TO DETECT THE START OF THE DESIRED INTERVAL. COMPARATOR 92 IS SET TO DETECT THE END OF THE DESIRED INTERVAL, AND THE SWEEP PERIOD IS SET SO THAT THE ENTIRE TIME INTERVAL TO BE MEASURED IS DISPLAYED.

SET TIME INTERVAL OF TIMER 25 TO ZERO.
SET STEP SIZE TO 10% OF SWEEP PERIOD.
SET DETECTOR 29 TO MODE B.

RESET DETECTOR 29, WAIT TWICE THE SWEEP PERIOD, READ DETECTOR 29.

MINIMUM STEP SIZE IS .001% OF SWEEP PERIOD OR RESOLUTION LIMIT OF TIMER, WHICHEVER IS GREATER.

FIGURE 13

METHOD AND APPARATUS FOR PROGRAMMABLE AND REMOTE NUMERIC CONTROL AND CALIBRATION OF ELECTRONIC INSTRUMENTATION

TABLE OF CONTENTS

Abstract
Background of the Invention
Summary of the Invention
Description of the Drawings
Description of the Preferred Embodiment
  System Architecture
  Calibration
    Manual
    Semi-Automatic
    Automated
  Setup
    Manual
    Semi-Automatic
    Automatic
  External Control
  Measurement
Claims

BACKGROUND OF THE INVENTION

Analog signal measuring, generating or processing apparatus are usually equipped with manually operable controls such as rotary switches, potentiometers, verniers and the like each having appropriate front panel legends. Besides taking substantial panel and chassis space, these controls frequently do not provide the accuracy or resolution desired. Furthermore, the mechanical interface constrains the layout of electronic circuitry and makes remotely controlled and automatic measurements extremely difficult to implement.

One solution to the above-mentioned problems is shown in U.S. Pat. No. 3,629,845 which provides digital adjustment of the functions formerly adjusted manually by the operator. A parameter of a circuit to be controlled is displayed and manipulated by a digital logic circuit that is controlled by the operator from a digital incrementer on a control panel. The parameter may be incremented or decremented, but the determination and amount of each increment is fixed and without regard to circuit or instrument calibration.

Conventional electronic instrumentation, particularly measuring instruments, from time-to-time require calibration to compensate for changes in component values and characteristics and changes in operating environment, to accommodate different measurements by the same instrument and to perform many of the same measurements by several of the same instruments. Typically, prior art instruments employed manually adjusted variable resistors, capacitors, inductors and the like to maximize instrument performance under particular conditions for a specific measurement.

SUMMARY OF THE INVENTION

In electronic instrumentation constructed according to the principles of this invention, the electronic signal being measured or produced is not first converted to digital form, processed, then reconverted to its original form (as modified by whatever processing is performed); rather the electronic signal processing means which modifies or produces the electronic signal is controlled by the numeric control system described in this specification. Thus, the numeric control system of the present invention acts on the signal processing means, and not on the signal it receives or produces, and without interrupting the signal processing path.

The present invention uses a microprocessor which computes numeric values for each digital control signal (DCS) which is converted to at least one corresponding analog control signal (ACS) by digital-to-analog converter (DAC) circuitry. The analog control signals are then applied to the circuit under control (CUC) to perform the functions of control and calibration potentiometers and other variable components without interrupting processing of the electronic signal being measured or produced. While the preferred embodiment of this invention is an oscilloscope, the principles shown herein are equally applicable to any electronic instrument which measures or produces electronic signals and is manually or computer controlled. If the instrument is also calibrated from time-to-time to achieve and maintain desired performance levels, the present invention can perform that calibration automatically.

Calibration as well as user control at the front panel of the oscilloscope of the present invention is without the use of potentiometers, switches and similar manually operable components. Familiar front panel switches, potentiometers and knobs found in a conventional scope are replaced by pushbuttons. Dials and front panel legends are replaced by digital displays such as light emitting diode (LED) displays.

Control settings of operational parameters of various functions of the oscilloscope, including sensitivity, position, sweep speeds, trigger level and delay, are numerically controlled as described above, adjustments being initiated by the operator merely by depressing appropriate pushbuttons. The pushbuttons activate the microprocessor which increments and decrements DCS's to achieve the desired display or effect via ACS's and stores numbers representing those DCS's in memory. The numbers representing DCS's are determined by control function equations employing parameter control setting values and calibration factors also stored in memory. The microprocessor also computes calibration factors for changing conditions, environments or component characteristics by simultaneous solution of control function equations. Finally, the microprocessor increments or decrements the numerical value of the parameter control settings for display to the user in response to commands input by the user via front panel pushbuttons. The new parameter control settings are then displayed on digital displays in familiar units such as volts/division or microseconds/division.

Since the calibration factors and control settings are in numerical form they may be recorded on any suitable digital recording medium by appropriate means for future reestablishment of those factors and settings. Thus, the instrument may be externally programmed and remotely controlled and calibrated for automatically performing a series of measurements. In addition to qualitative display of waveforms, the oscilloscope automatically performs quantitative measurements of those waveforms by computing the time and amplitude interval between two different points on a waveform. The oscilloscope may be recalibrated for particular external influences by simply loading prerecorded calibration data from a data card or other suitable medium. Furthermore, operational differences from instrument-to-instrument of the same type are substantially reduced by the accuracy and uniformity realized by the calibration technique of the present invention.

The oscilloscope of this invention has two modes: RUN and CAL. While in RUN mode, the oscilloscope performs like any conventional oscilloscope, except that adjustment of parameter control settings at the front panel is performed by depressing pushbuttons rather than turning knobs and setting switches.

In addition, the oscilloscope can perform an automatic "search" for a waveform. Sensitivity is changed until a predetermined arbitrary amplitude is displayed. When that amplitude is reached, the trigger level is automatically set, the sweep speed is adjusted to display a predetermined arbitrary number of waveform periods and an "in sync" waveform is presented to the user on the CRT.

When the instrument is to be calibrated, it is set to CAL mode. Calibration may be manual, semi-automatic or automated. Upon initiation of manual calibration of the particular function, a corresponding display illuminates, the appropriate calibration procedure stored in memory is initiated, and a test signal corresponding to the particular decade or range is supplied automatically (optionally, this signal may be supplied by external source). Sensitivity range is selectable at the user's discretion and the trace is adjusted to the prescribed position or size by the user. Thereafter, the computation of the calibration factors is initiated. For functions requiring more than one alignment, the setting and the test signals are changed automatically and, only after all alignments have been completed, the calibration factors are computed.

Functions which may be semi-automatically or "self" calibrated require neither manual alignment of waveforms on the CRT display nor external test equipment. For example, the frequency of an internal oscillator such as voltage controlled oscillator (VCO) may be calibrated automatically using a microprocessor-controlled counter which counts the periods of the oscillator output signal. That count is compared with a reference count; the difference, if any, is used to determine the necessary adjustment of the oscillator frequency.

Automated calibration of the oscilloscope is possible with a programmable calibrator. The calibrator plugs into the oscilloscope to provide the controls for calibration. Signals are applied to appropriate inputs of the scope. The CRT display is "read" with an optical reader employing sensors such as photodetectors, the output of which being used as feedback for the calibrator. A control pushbutton on the calibrator starts the sequence. Upon completion of each calibration step, the calibrator automatically moves to the next step until the entire oscilloscope is calibrated.

DESCRIPTION OF THE DRAWINGS

FIG. 11 is a flow diagram of the automatic setup of sweep speed control settings to display one period of input signal in the oscilloscope of FIG. 3.

FIG. 13 is a flow diagram for automatic measurement of time interval.

DESCRIPTION OF THE PREFERRED EMBODIMENT

System Architecture

Figure 2:
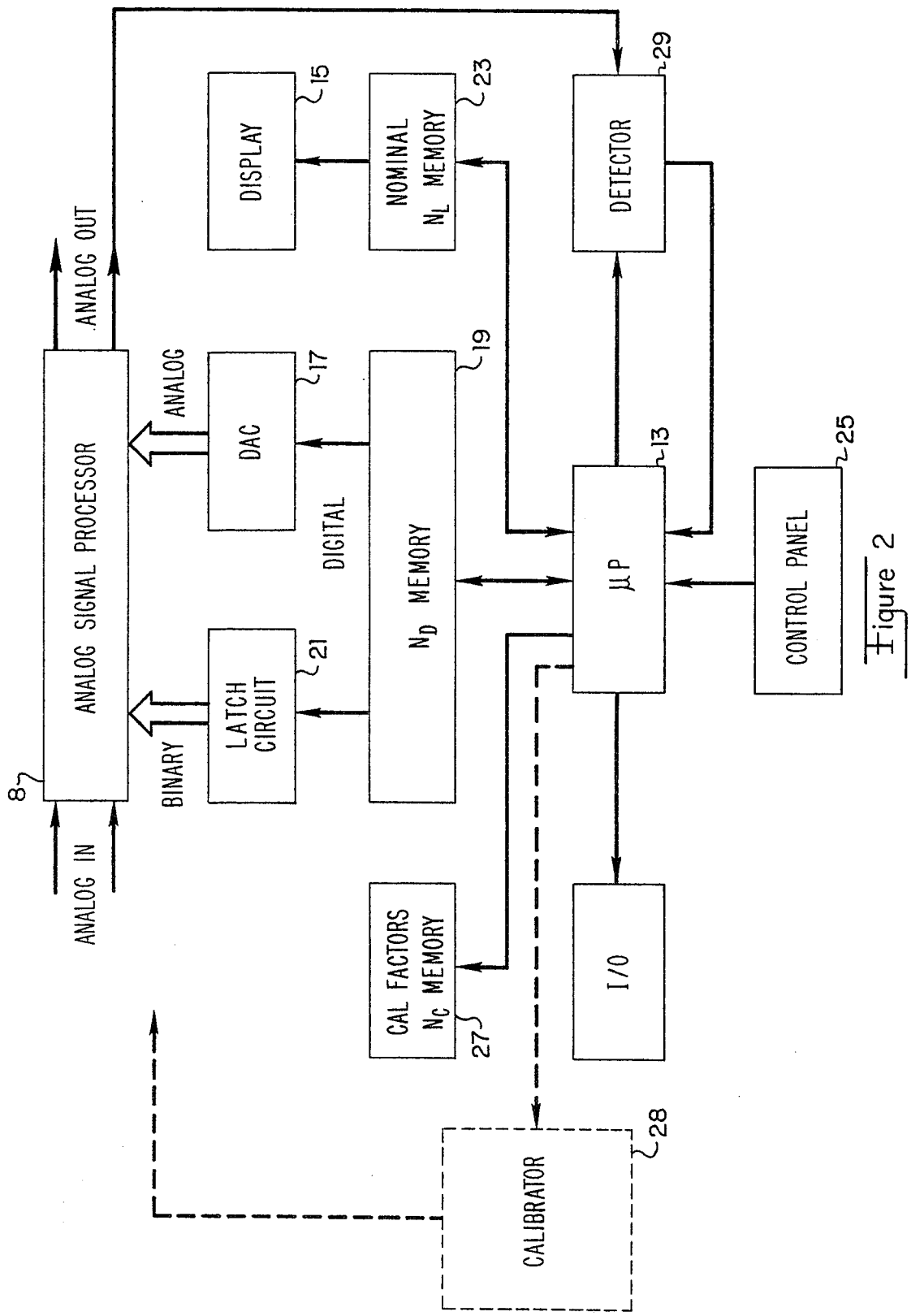
FIG. 2 is a block diagram of the numeric control system of FIG. 1 including capability for calibration of the instrument.

Referring to FIG. 2, many parameters of analog signal processing (ASP) circuit 8 may be numerically controlled. If ASP circuit 8 were one channel of an oscilloscope, one such controllable parameter would be sensitivity. Control of vertical sensitivity may be translated into simply controlling the gain of an amplifier. Therefore, numerical control of amplifier gain according to the principles of the present invention is described below.

Figure 1:
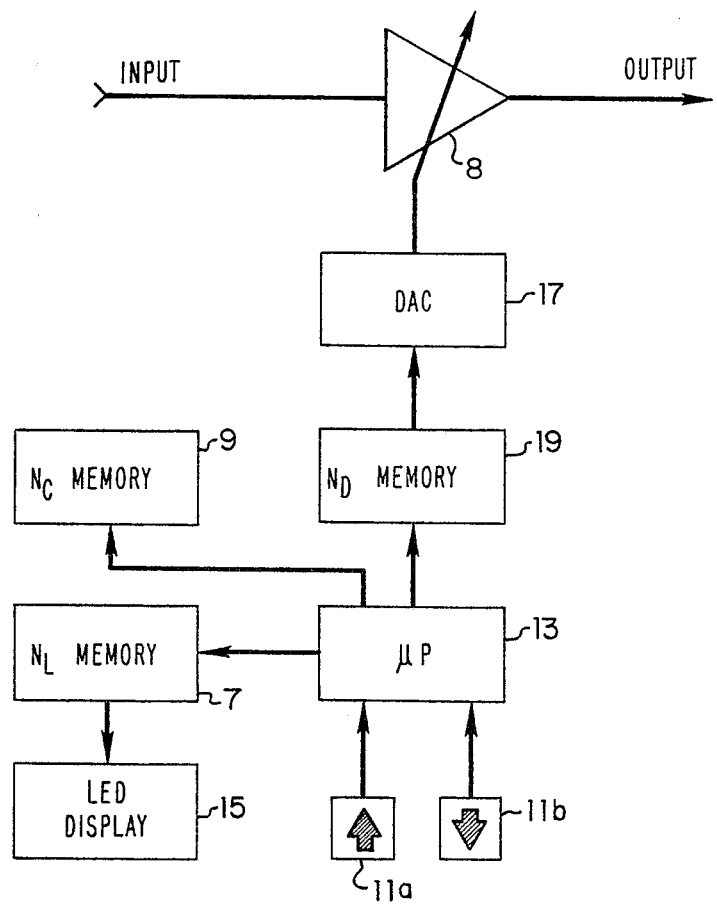
FIG. 1 is a block diagram representing a numeric control system for electronic instrumentation constructed according to the principles of the present invention.

Referring now to FIG. 1, a numerical control system for adjustment of the gain of analog signal amplifier 8 according to the present invention is shown. Control of the gain is available at the front panel via pushbuttons 11a and 11b. The command for a change in gain is initiated by actuating incrementing or decrementing pushbuttons 11a and 11b, respectively. Only wire connect the command signals to microprocessor 13.

In a numerically controlled amplifier according to this invention, display of the gain setting is provided by digital display 15 which displays a nominal numerical value $N_L$, representing the gain control setting desired by the user. $N_L$ is also stored in $N_L$ memory 7.

In the numerically controlled configuration of the present invention, gain is set by DAC 17 which produces an ACS from a DCS determined from a numerical value, $N_D$, computed by microprocessor 13. $N_D$, which determines the characteristic of the ACS for controlling the gain, is stored in $N_D$ memory 19 and will be hereinafter referred to as the DAC signal.

Calibration is determined by calibration factors, $N_C$, in the numerically controlled amplifier in the present invention. $N_C$ factors are stored in $N_C$ memory 9, the values of which are computed by microprocessor 13. $N_C$ factors provide the necessary correction to values of $N_D$ to be calculated.

Calculation of numerical values $N_D$ and $N_C$ for the numerically controlled amplifier corresponds generally to mechanical adjustment of potentiometers in a conventionally controlled amplifier. Microprocessor 13 calculates new values of DAC signals, $N_D$, in response to control setting, $N_L$, in view of calibration factors $N_C$.

Furthermore, since the digital values representing the DCS's are so calculated, control function equations may be as complex as necessary, functionally dependent on the input and output signals, as well as on the structure of the instrument.

FIG. 2 shows a numerically controlled ASP according to the present invention further including calibration and measurement capabilities. Such an instrument is a controllable analog system transforming unknown analog signals into known or desired analog signals. However, as noted above, the analog signal is not first converted to digital form, processed, then reconverted back to analog form for display on the CRT. Rather, ACS's produced in response to DAC signals for controlling parameters of the ASP are applied to the ASP. Thus, the signal path of the processed analog signal is not interrupted by digital control or processing circuitry.

In the oscilloscope of this invention, for each function of the instrument, there is a set of parameter control settings, $N_L$. For each value of $N_L$ of the set, there is a corresponding ACS coupled to the CUC which is determined by DAC signal, $N_D$. Thus, for the general case, the control function equation is of the form $$N_D = f(N_L, N_C). \tag{1}$$

For the simpler, linear case applicable to many CUC's, $N_D$ is related to $N_L$ by a control function equation generally of the form $$N_D = aN_L + b \tag{2}$$

where $a$ and $b$ are calibration factors also referred to herein as $N_C$ factors. Control function equations are further discussed later in this specification.

CUC's of the oscilloscope described herein are of two types, depending on the ACS required. Analog switches are turned on and off by binary signals, the first type, while amplifiers are controlled by ACS's generated from numerical values. Thus, both binary and analog signals are required to control the oscilloscope.

DAC signals are stored as digital values in $N_D$ memory 19. DAC 17 generates suitable ACS's and latch circuit 21 produces necessary binary control signals (BCS's) in response thereto. With proper organization of $N_D$ memory 19, ACS's can be continuously generated and a steady state condition sustained by the cooperation of $N_D$ memory 19 and DAC 17. Nominal values of parameter control settings, $N_L$, of controllable elements are stored in $N_L$ memory 23 and displayed by digital display 15.

Calibration

Figure 3:
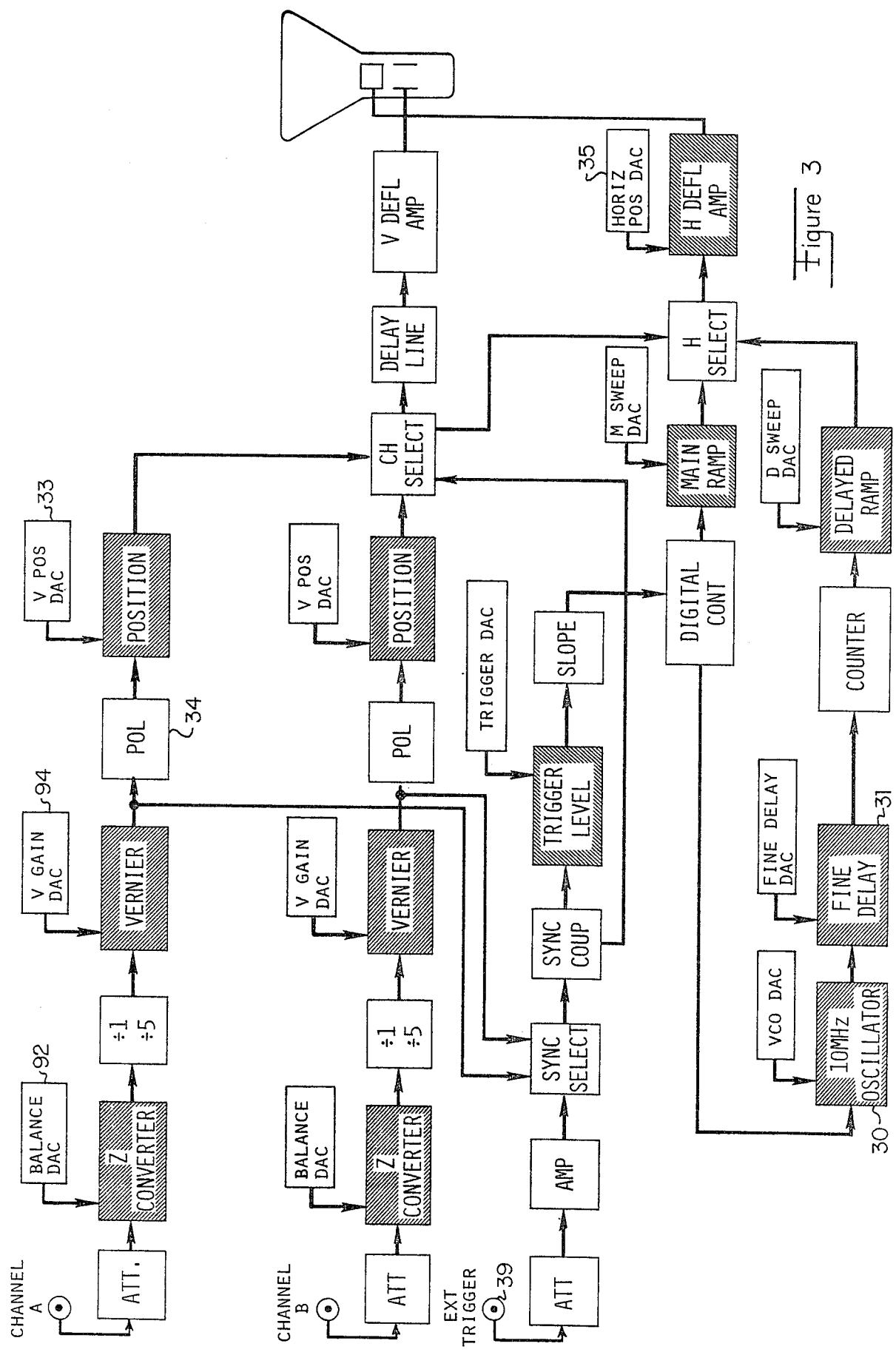
FIG. 3 is a block diagram representing a numeric control system for an oscilloscope constructed according to the preferred embodiment of the present invention.
Figure 4:
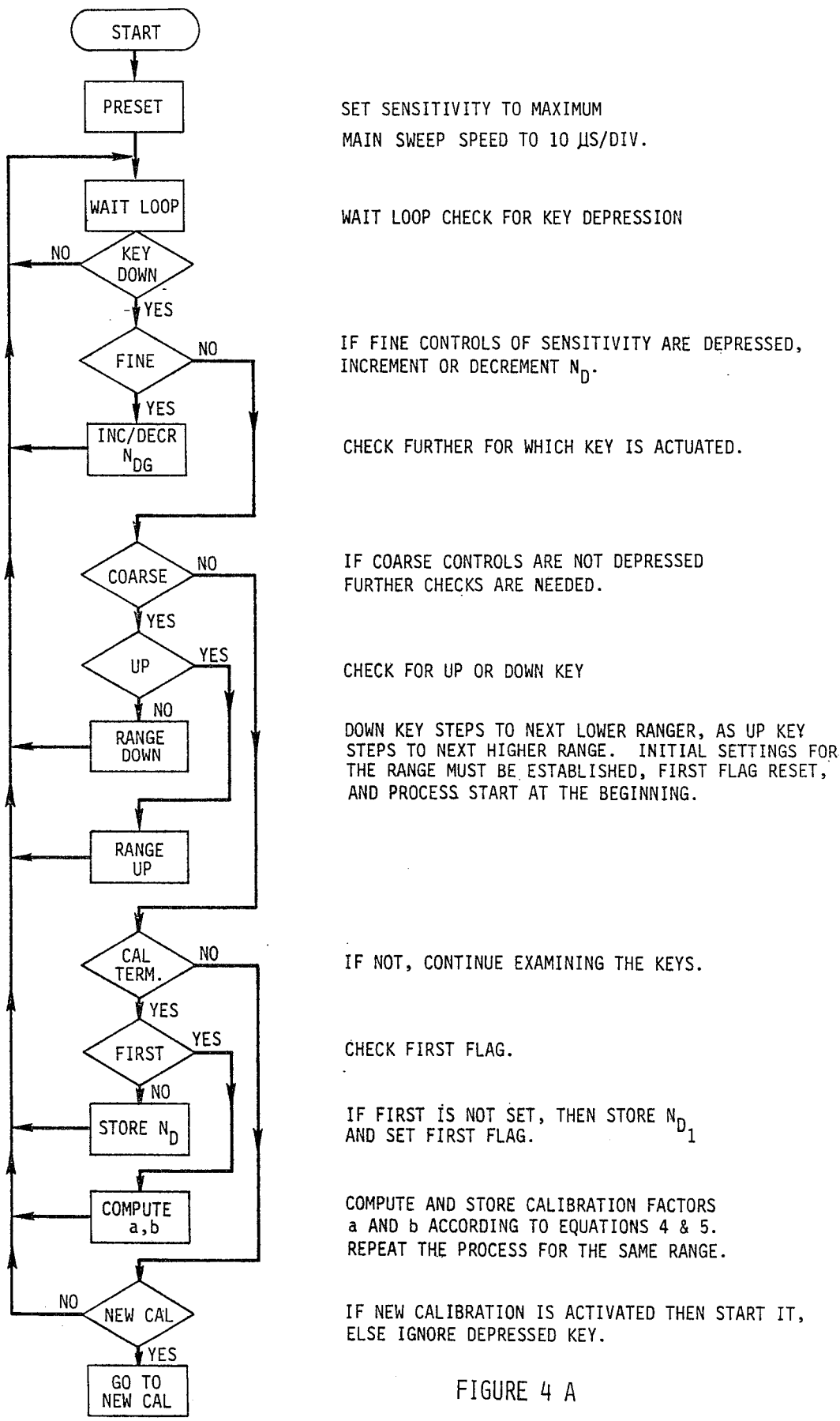
FIG. 4a is a flow diagram for computing vertical sensitivity calibration factors for the oscilloscope of FIG. 3.

Functions like sensitivity, position and trigger level are calibrated by adjustment of a DC voltage. As such, the DC voltages are numerically controlled through DAC's by simply changing the number corresponding to the particular voltage. The numbers are modified according to the function control equations by $N_C$ factors representing deviations from the desired response as measured during calibration. The shadowed blocks in FIG. 3 identify the particular functions in the oscilloscope whose circuits are controlled and calibrated by the numerical control system of this invention. A calibration procedure using internally or externally generated reference signals is incorporated into the instrument. The same controls which are used to operate the functions in RUN mode are used when the instrument is in CAL mode.

The instrument may be set to CAL mode by reading of calibration factors coded for the particular instrument from a prerecorded medium, or the recorded factors may be preceded by a special interlock code which initiates CAL mode and is unique to the particular instrument. Of course, CAL mode may also be controlled by a separate prerecording containing the interlock code or, as noted above, by a simple front panel control, and $N_C$ factors may be stored in internal or external memory or on prerecorded medium. Once in the CAL mode, calibration may be performed under human or machine control.

Manual

In the preferred embodiment, $N_C$ factors, preceded by interlock code, are previously recorded on a magnetic card which is read by a card reader/recorder similar to the type disclosed in U.S. Pat. No. 3,893,173. Upon entry of $N_C$ factors into memory, the appropriate calibration program stored in memory is activated. It provides an internally generated test signal matched to the decade or range selected. After the trace is aligned by the operator to the prescribed position or size, the computation of the $N_C$ factors for the particular CUC is initiated. For CUC's requiring two alignments, the setting and the test signal are changed under program control and, only after the second alignment, the $N_C$ factors are computed.

For each function of the instrument, there is a set of control settings, $N_L$, for which the circuit performing that function must be calibrated. For each value of $N_L$ of the set, there is a corresponding reference signal defined by DAC signal, $N_D$, to be coupled to the particular CUC. The reference signal must produce a predetermined output signal from the CUC for calibration. At the start of calibration, the operator actuates front panel pushbutton controls to direct the microprocessor to change $N_D$ until a desired output is displayed. Microprocessor 13 selects $N_{L1}$ and computes the corresponding $N_{D1}$. If the desired and predetermined outputs are different, the front panel pushbuttons are actuated by the operator to change $N_{D1}$ until the predetermined and desired outputs are equal. At that time $N_{D1}$ is stored, $N_{L2}$ is selected and $N_{D2}$ is calculated in a similar manner. From the two sets of numbers, $N_{L1,2}$ and $N_{D1,2}$ required for linear relations, $N_C$ factors are computed by simultaneous solution of equations of type (1) and stored for use in RUN mode. The process is repeated until the complete set of $N_C$'s are generated for all CUC's.

Referring again to FIG. 2, the sensitivity of the vertical and horizontal amplifiers is displayed to the user by display 15, with three digits of resolution. Thus, the range for $N_L$ is from 100 to 999. Since values of $N_C$ are to be stored for future use and memory size is limited, the $N_C$ factors $a$ and $b$ are limited to 2 digits each, providing a range of 0 to 99 for $a$ and $b$. Considerations such as the capability of the DAC's impose the range 0 to 2999 for $N_D$.

To calibrate the sensitivity of the vertical amplifiers, coefficients $a$ and $b$ are calculated in CAL mode as described above using the equation given below which satisfies the above-mentioned criteria:

$$N_D = \left(2 + \frac{a}{100}\right) \cdot N_L - 2b \quad (3)$$

For two known inputs, $N_{L1}$ and $N_{L2}$, the desired output is produced by depressing the appropriate pushbutton control while observing the CRT display. Corresponding values of $N_{D1}$ and $N_{D2}$ are then computed and recorded as shown in the flow diagram of FIG. 4a. Substituting these values in equation (3) to form two simultaneous equations and solving for $a$ and $b$ yields the required $N_C$ factors:

$$a = 100\left(\frac{N_{D1} - N_{D2}}{N_{L1} - N_{L2}} - 2\right) \quad (4)$$

$$b = \frac{1}{2}\left(\frac{N_{D2}N_{L1} - N_{D1}N_{L2}}{N_{L2} - N_{L1}}\right) \quad (5)$$

Figure 4B:
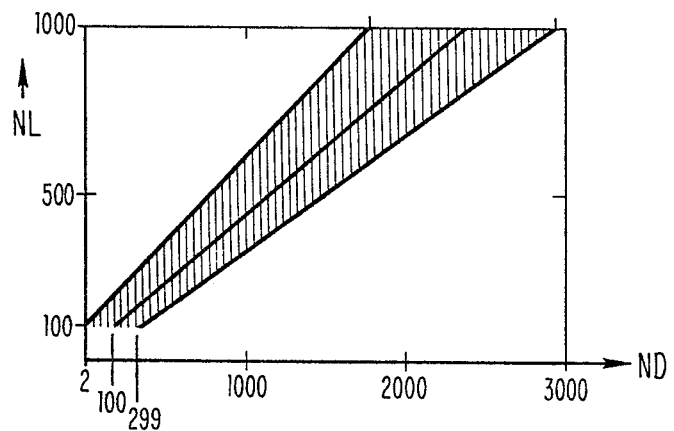
FIG. 4b illustrates the range and average values for vertical sensitivity calibration of the oscilloscope of FIG. 3.

FIG. 4b shows the range and the average for sensitivity calibration. The lower limit, $N_{Dmin}$, is at $N_L = 100$, $a = 0$ and $b = 99$. Thus $$N_{Dmin} = \left(2 + \frac{0}{100}\right)100 - 198 = 2 > 0.$$

The upper limit, $N_{Dmax}$, is at $N_L = 999$, $a = 99$, and $b = 0$, giving $$N_{Dmax} = \left(2 + \frac{99}{100}\right)1000 - 0 = 2990 < 2999.$$

The table below lists the functions of an oscilloscope constructed according to the preferred embodiment of this invention which are capable of manual calibration in the CAL mode. The respective $N_C$ factors which must be calibrated and stored, and the types of test signal required are also listed.

TABLE I

| | Factors | | Test |
|---|---|---|---|
| | a | b | Signal |
| 1. Vertical Position Channel A | 1 | 2 | no input |
| 2. Vertical Position Channel B | 1 | 2 | no input |
| 3. Horizontal Position | 1 | 2 | no input |
| 4. Sensitivity Channel A | 4 | 1 |  100 KHz |
| 5. Sensitivity Channel B | 4 | 1 |  100 KHz |
| 6. Fine Delay | 1 | 1 |  10 MHz |
| 7. Main Sweep Speed | 9 | 1 | no input |
| 8. Delayed Sweep Speed | 7 | 1 | no input |
| 9. Trigger Level | 1 | 2 | no input |
| 10. Brightness | 1 | 1 | no input |

The test signals are automatically applied to the vertical amplifiers. They are referenced to a $-12V \pm 0.1\%$ voltage source and are limited to 10V peak amplitude.

Semi-Automatic

The calibration procedure described above was initiated and executed manually via front panel controls. Semi-automatic calibration is provided for circuits requiring more frequent calibration. For example, the frequency of the delay oscillator and the balance of the vertical channels may vary substantially with time and require frequent calibration. In the preferred embodiment of this invention, the user may initiate semi-automatic calibration of these functions while continuing operation in the RUN mode. By way of example, self-calibration of the delay oscillator is described below in this specification. No trace observation or adjustment by the user or calibrator is necessary for such calibration procedures once the procedure has been initiated.

Figure 5:
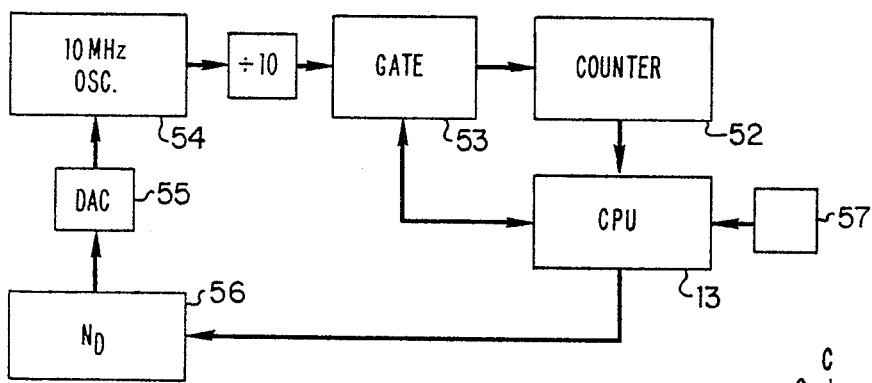
FIG. 5 is a block diagram representing the self-calibration of an oscillator in the oscilloscope of FIG. 3.
Figure 6:
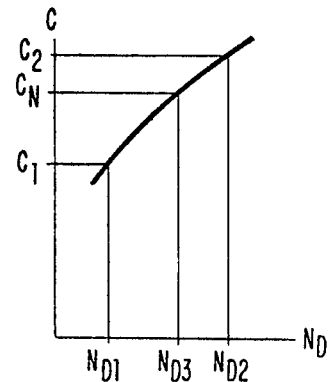
FIG. 6 illustrates the linear slope interpolation performed for calibration of the oscillator in FIG. 5.
Figure 7:
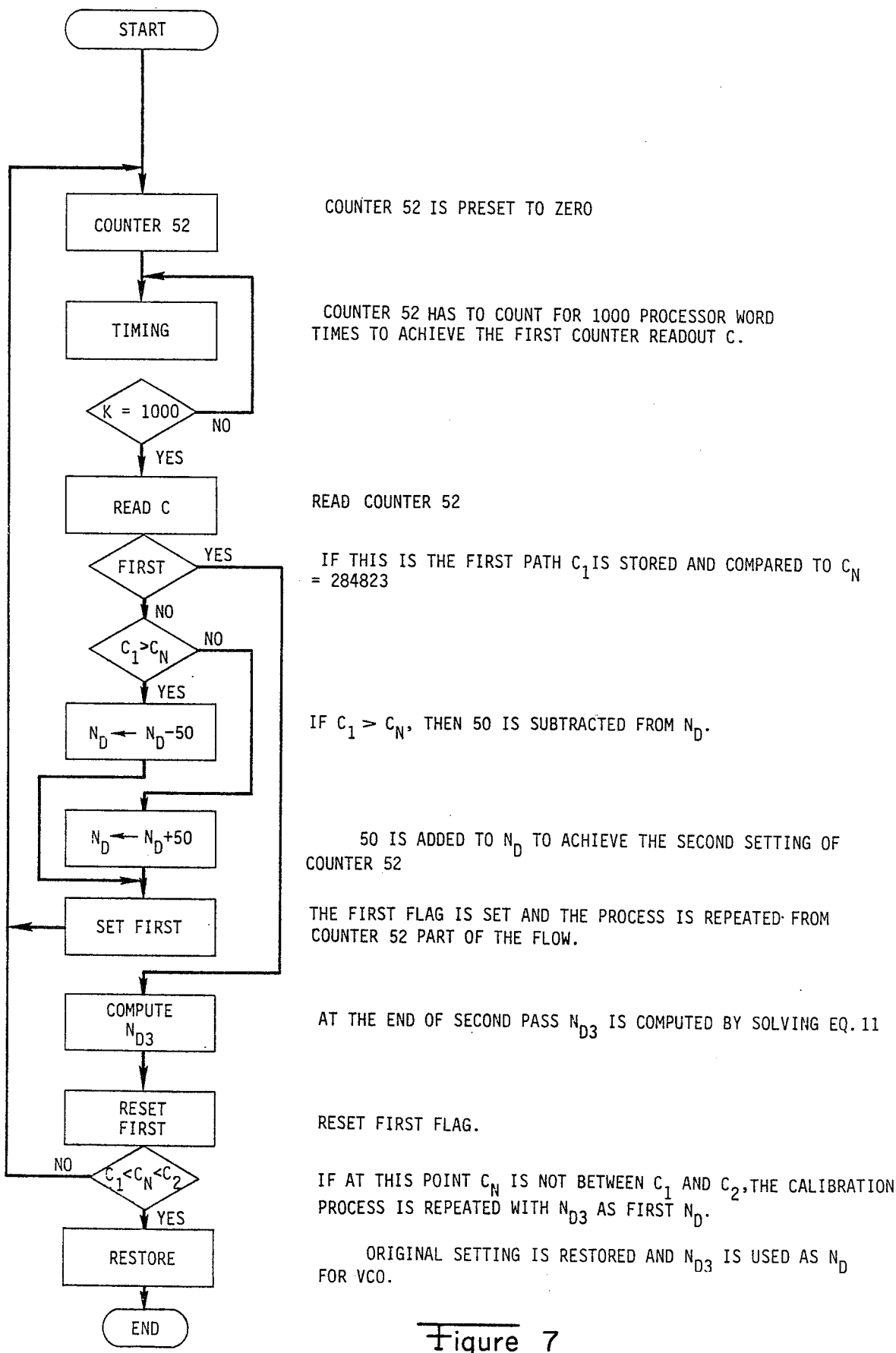
FIG. 7 is a flow diagram of self-calibration of the oscillator in the oscilloscope of FIG. 3.

Referring to FIGS. 5 and 7, the accuracy of time measurements is a function of 10 MHz voltage-controlled delay oscillator (VCO) 54. Its frequency is calibrated by setting a DC voltage from DAC 55, where the crystal controlled time of a microprocessor 13 is used as the reference. The calibration procedure is initiated by actuating pushbutton 57 which causes microprocessor 13 to execute a program. Counter 52 counts the periods of the output signal of VCO 54 for 1000 word cycle times, where each word cycle time, $P = 284.823$ microseconds. Let $C_1$ be that count with $N_D = N_{D1}$. Microprocessor 13 then compares $C_1$ with $C_N$, the count of the periods of the output signal of VCO 54 at 10 WHz. If $C_1 > C_N$, then microprocessor 13 sets $N_{D2}$ to $N_{D1} - 50$; if $C_1 > C_N$, then microprocessor 13 sets $N_{D2}$ to $N_{D1} + 50$. Microprocessor 13 then directs counter 52 to count the periods of the output signal of VCO 54 to determine a new count $C_2$ for $N_D = N_{D2}$. Using the measured values of $C_1$ and $C_2$, microprocessor 13 performs a linear interpolation resulting in a new value of $N_D = N_{D3}$ according to the following relation:

$$N_{D3} = N_{D1} + \frac{(C_N - C_1)}{(C_2 - C_1)}(N_2 - N_{D1}) \quad (11)$$

where $C_N = 284823$

If $N_{D3}$ falls between $N_{D1}$ and $N_{D2}$, VCO 54 is calibrated. If $N_{D3}$ is not between these values, then the last value of $N_{D3}$ is used as the new value of $N_{D1}$ and the process is repeated.

Thus, the VCO calibration process consists of two successive counts followed by the evaluation of equation (11). $N_{D3}$ is then used as the input to DAC 55 controlling the frequency of oscillator 54 until the next actuation of front panel pushbutton 57. The entire process is automatic and complete in approximately one second without user intervention during the process and without special calibrator apparatus.

Automated Calibration

Figure 8:
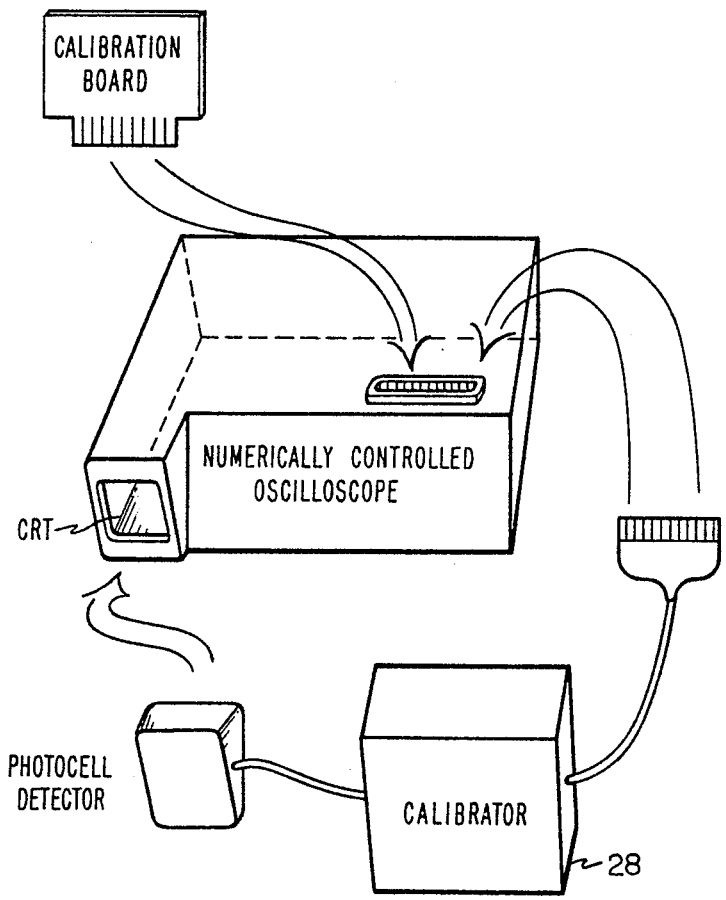
FIG. 8 illustrates automated calibration of the oscilloscope of FIG. 3.

Automated calibration of the oscilloscope is possible using the calibrator as shown in FIG. 8. The calibrator provides the external program control, test signals and trace observation for calibration. Test signals are applied to channel A, channel B and EXT inputs of the oscilloscope which is set to CAL mode. The CRT trace display is "observed" by a cross of photodetectors, or other equivalent illumination detection system, which is used in the feedback loop. Actuation of a control button on the calibrator starts the sequence. Upon completion of a calibration step in the sequence, the calibrator automatically moves to the next step until the entire scope is calibrated. Calibration can be terminated at any time by simply recording the factors and switching the oscilloscope back to the RUN mode.

Setup

Manual

To manually prepare the oscilloscope for making measurements, ACS's must be changed to achieve the desired output presentation of the signals to be measured. These changes are initiated and controlled by actuating pushbuttons on front panel 25. For example, to increase the amplitude of a signal displayed on the CRT, the sensitivity (i.e., gain) of a vertical deflection amplifier must be increased. A pushbutton for incrementing the gain of that amplifier is continuously depressed to activate microprocessor 13 to execute a prescribed routine. The nominal value of $N_L$ is called from memory 23, incremented and sent back to that memory; appropriate $N_C$ factors are then called from $N_C$ memory 27; $N_D$, the numerical value of the gain DAC signal, is then calculated by executing the control function equation employing the nominal $N_{L\ value\ and\ NC}$ factors. The new value $N_D$ is then stored in $N_D$ memory 19, transmitted to DAC 17 which in turn produces the control signal by which the vertical amplifier gain is increased. This iterative procedure is repeated until the pushbutton is released. A similar sequence is employed for manual adjustment of other parameters of waveform measurement such as sweep speed, trigger level and horizontal sensitivity. Likewise, a similar iteration is utilized to change BCS's produced by latch circuit 21 to effect control of analog latches.

Semi-Automatic

For some measurements and observations to be performed by the oscilloscope of this invention the operator may know some of the control settings for some of the functions of the oscilloscope such as sweep speed, sensitivity, trigger level and the like. The operator may know this information from having made the measurement previously and recording the necessary data on a magnetic data card for later use. Thus, the operator may read the magnetic data card into the oscilloscope, which then automatically sets up the machine for the measurements he wishes to make.

Automatic

Figure 9:
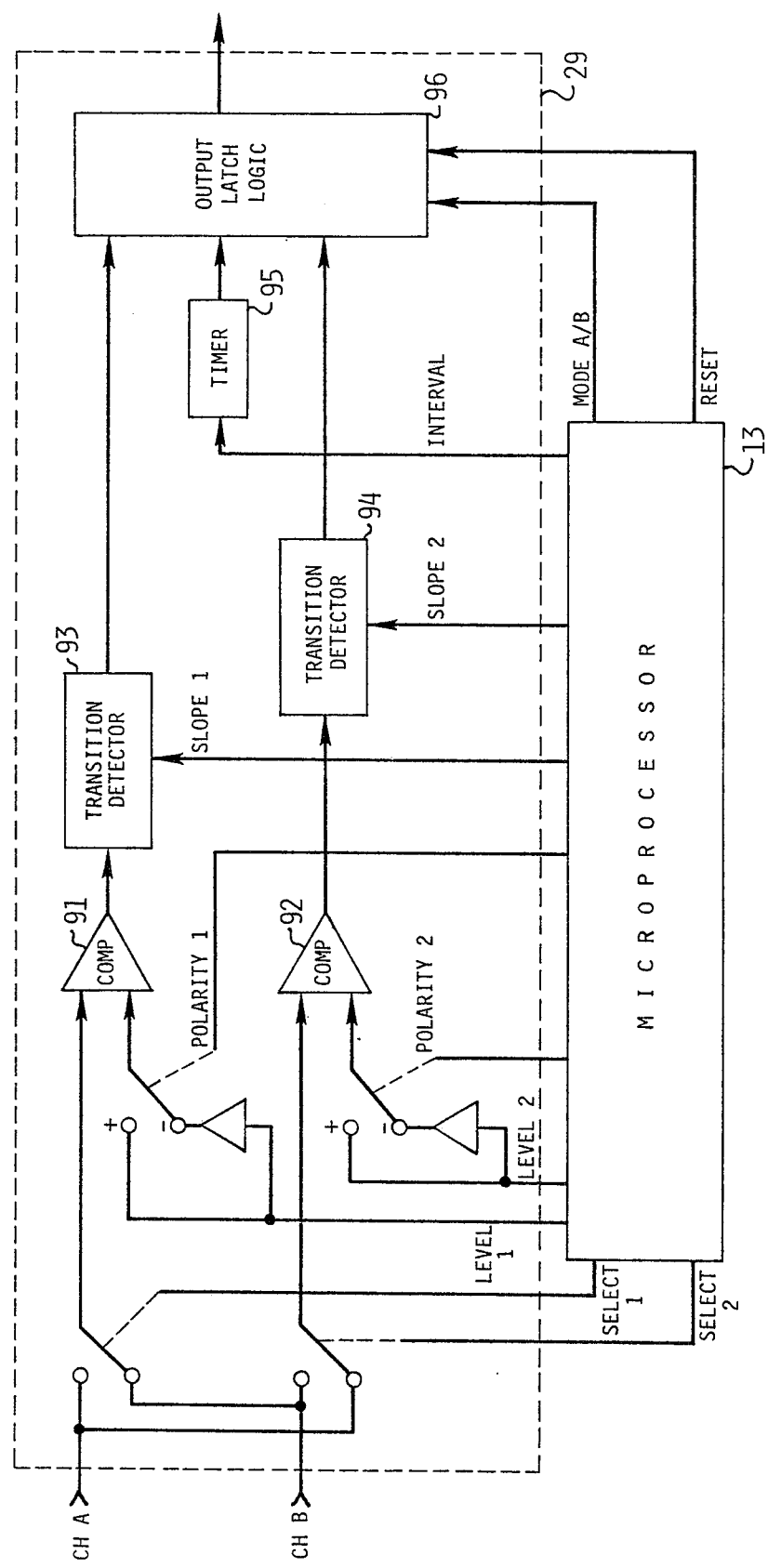
FIG. 9 is a block diagram of detector 29 in the oscilloscope of FIG. 3.

Automatic setup and measurement modes are implemented using detector 29 shown in FIG. 2. Referring to FIG. 9, detector 29 consists of comparators 91 and 92, timer 95, transition detectors 93 and 94 and output latch logic 96. Microprocessor 13 selects the signal source, and sets the slope and comparison level for each comparator, sets the time interval of timer 95 and reads the output of output latch logic 96.

Detector 29 operates in two different modes: Mode A and Mode B. For Mode A operation, comparator 91 monitors the input voltage for transitions which meet selected conditions. Timer 95 is initiated by one of these transitions. Output latch logic 96 provides a "true" output if a second transition meeting the selected conditions of voltage, amplitude and slope occurs on the same signal within the time interval determined by timer 95.

Comparator 92 and transition detector 94 are used only in Mode B operation of detector 29. Comparator 92 and transition detector 94 are enabled upon detection of an input voltage transition by comparator 91 and transition detector 93 which meet the selected threshold conditions. Once again interval timer 95 is initiated, after which time, comparator 92 and transition detector 94 monitor their input voltage waveforms for transitions. Output latch logic 96 provides a "true" output if a transition of selected slope and amplitude occurs on the signal being monitored by comparator 92 and transition detector 94 during the time interval determined by timer 95.

Figure 10:
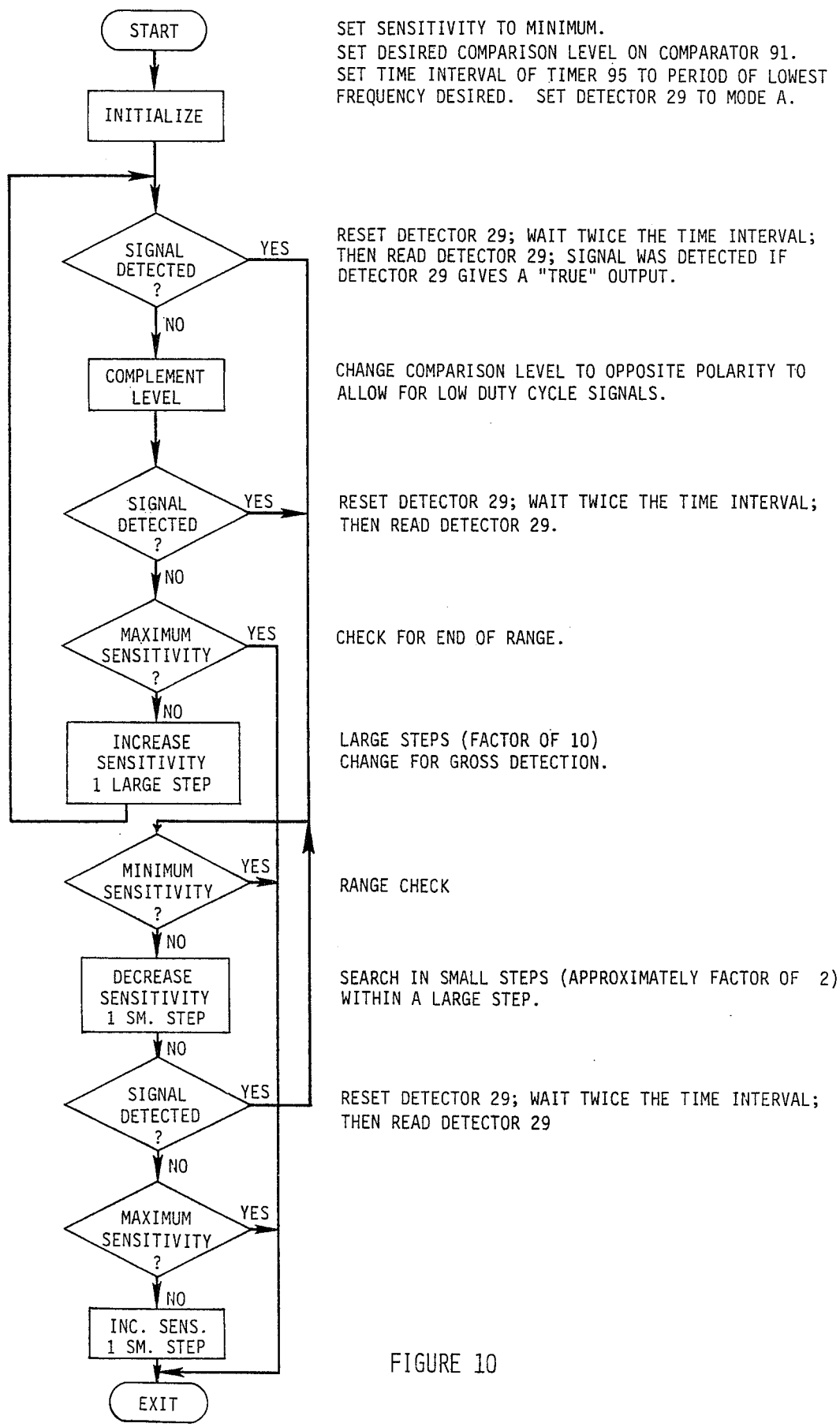
FIG. 10 is a flow diagram of the automatic setup of sensitivity control settings in the oscilloscope of FIG. 3.

The oscilloscope of the present invention uses the procedure illustrated by the algorithm given in FIG. 10 to automatically search for the proper vertical sensitivities to provide a usable presentation of waveforms applied to its inputs. Once the sensitivity has been setup automatically, the trigger level can also be setup automatically to the mid-point of the waveform. The procedure used for automatic trigger level setup is described later in this specification under the heading "Automatic Period Measurement". Comparator 91 and transition detector 93 are involved since they serve as the primary trigger circuit of the oscilloscope. Similarly, the oscilloscope uses the procedure illustrated by the flow chart given in FIG. 11 to search for the proper sweep speed necessary to provide a useable presentation of input waveforms after the vertical sensitivity and trigger level have been set.

External Control

The preferred embodiment of the present invention provides for an I/O port to receive signals from an external source. Thus, an external, remote controller may adjust the control settings of the instrument by setting values of $N_L$ and request the instrument to perform a measurement and a set or sequence of measurements. Recording of $N_D$ values is unnecessary since they are computed from $N_C$ and $N_L$ values by microprocessor 13. As mentioned earlier in this specification, any suitable method of recording $N_C$ and $N_L$ values may be used.

Measurement

The oscilloscope incorporating the present invention permits its operator to qualitatively observe waveforms as is possible with any conventional oscilloscope. In addition, the present invention provides the operator with the capability to perform quantitative measurement in units of amplitude and time of the displayed waveform. The following paragraphs describe how the present invention performs various quantitative measurements on request by either a human operator or an external remote controller.

Peak-to-Peak Voltage Measurement

The oscilloscope of the present invention must first be set up either manually, automatically, or by external control so that both peaks of the waveform are on screen vertically and at least one period is on screen horizontally. When a peak-to-peak voltage measurement is requested on a particular channel, microprocessor 13 first selects that channel as the input to comparator 91 and selects positive comparator polarity and AC coupling for that input channel. It then performs the peak voltage measurement algorithm of FIG. 12. Next it sets the polarity negative and measures the peak voltage again according to FIG. 12. The difference between these two voltages is then computed and displayed by microprocessor 13.

Average DC Voltage Measurement

Figure 12:
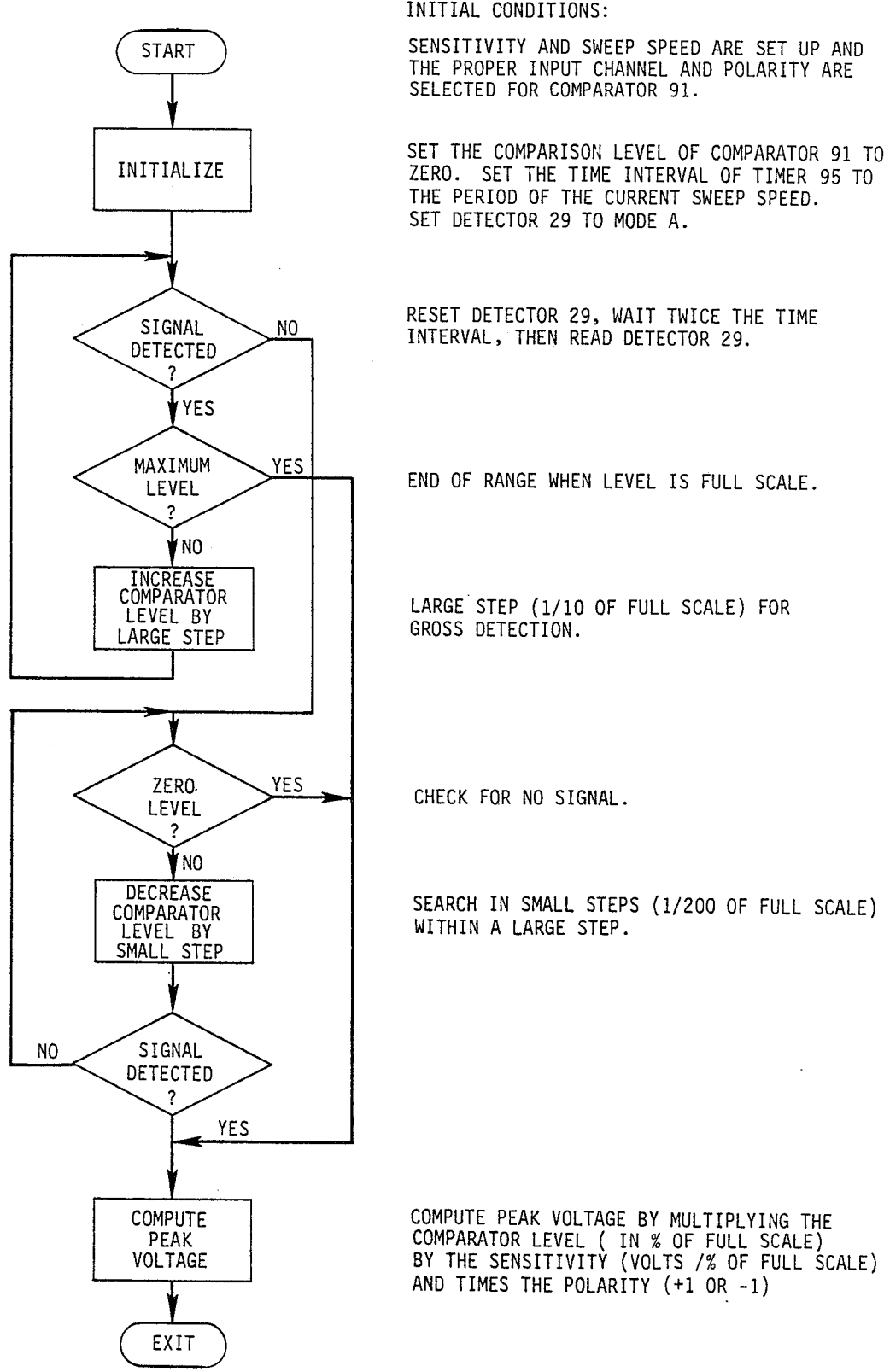
FIG. 12 is a flow diagram for automatic measurement of peak voltage.

With the input signal AC coupled to the oscilloscope, microprocessor 13 performs a peak voltage measurement for positive polarity according to FIG. 12 with the selected channel AC coupled. It then switches the input coupling to DC and performs the same peak voltage measurement a second time for the same waveform. Microprocessor 13 then computes and displays the difference between the two peak voltage levels determined.

Time Interval Measurement

Microprocessor 13 can perform an automatic time interval measurement. Prior to performing this measurement, a manual, automatic, or externally controlled setup of detector 29 must be made by setting comparator 91 and transition detector 93 to detect the transition which indicates the beginning of the desired time interval, and setting comparator 92 and transition detector 94 to detect the transition which indicates the end of the interval. Also the sweep speed must be adjusted (either manually or automatically) so that the sweep period is greater than the time interval to be measured. Starting from these initial conditions, microprocessor 13 performs the algorithm given in FIG. 13 to measure and display the desired time interval. By choosing appropriate initial conditions this same algorithm can be used for making a variety of timing measurements including period, frequency, rise time, pulse width, duty cycle, and propagation delay.

Period Measurement

Microprocessor 13 can automatically measure the period of a waveform by performing the following steps. First it uses the automatic setup procedures described above to setup the vertical sensitivity and sweep speed for the desired signal. Next it performs the voltage measurement procedures to measure the peak-to-peak and average DC voltages of the waveform as described above. From these values it computes the mid point of the waveform, sets the levels of comparators 91 and 92 to this level, and sets positive slope on transition detectors 93 and 94. Then it performs the time interval measurement algorithm of FIG. 13 to measure and display the period of the selected waveform. This algorithm is useful only for waveforms that, when AC coupled, have only one positive going zero crossing per period.

Frequency Measurement

Microprocessor 13 performs the same measurement of the period of the input waveform as described above for period measurements. The microprocessor then computes the reciprocal of the interval found and displays the frequency to the operator on front panel digital display 15.

Pulse Width Measurement

Microprocessor 13 performs the period measurement procedure except that the slopes of transition detectors 93 and 94 are set to opposite values. For example, for positive pulses the slope of transition detector 93 is positive while the slope of transition detector 94 is negative. The converse values are set for negative pulses.

Duty Cycle Measurement

An automatic duty cycle measurement can be made by microprocessor 13 by making two pulse width measurements with opposite settings of the slopes, and then computing and displaying the quotient of the two measurements.

Rise and Fall Time Measurements

Rise time of a signal can be measured automatically by microprocessor 13 by following a procedure identical to that for period measurement except that comparator 91 is set to the start point of the rise or fall time of the waveform and comparator 92 is set to the end point (typically the 10 and 90% points). This proc-dure effectively determines the time interval between the 10–90% points on a positive going input signal (i.e. rise time). The converse of this procedure, including reversed level settings for detector 29, is effective for measuring fall times of pulses being applied to the input of the oscilloscope.

Propagation Delay Measurement

Microprocessor 13 selects a reference signal for comparator 91 and a delayed signal for comparator 92. The comparison levels are set to the mid-points of the selected signals in a manner similar to that described above for period measurement, after which microprocessor 13 performs the time interval measurement procedure of FIG. 13.

All of the above measurement procedures may be performed automatically by the microprocessor when requested by the operator or a remote controller for measurements. Using the time interval procedure, the oscilloscope may be set up manually by the operator, by a remote controller or by the microprocessor itself.

We claim:

1. Electronic signal processing apparatus for processing analog signals comprising:

memory means for storing digital data representing control settings of the analog operational functions performed by the apparatus, and for storing digital data representing calibration factors for calibrating said analog operational functions;

computing means coupled to the memory means for computing the numerical value of digital data representing operational control signals for controlling said analog operational functions as a mathematical function of corresponding control settings and calibration factors, and for storing the digital data representing said operation control signals in the memory means; and control means coupled to the memory means and computing means for producing operational control signals in response to the digital data representing said operational control signals, and applying the operational control signals to the analog operational functions associated with each of the control settings and calibration factors for processing the analog signals.

2. Apparatus as in claim 1 wherein the digital data representing the control settings, calibration factors and operational control signals are related according to the relationship $N_D = f(N_L, N_C)$, where $N_D$ is the numerical value of the operational control signals, $N_L$ is the numerical value of the control settings, and $N_C$ is the numerical value of the calibration factors.

3. Apparatus as in claim 2 wherein the computing means also computes the numerical value of $N_C$ by simultaneous solution of relationships of the form $N_D = f(N_L, N_C)$.

4. Apparatus as in claim 2 wherein the control settings, calibration factors and operational control signals are related according to the relationship having the form $N_D = a N_L + b$ where $N_D$ is the numerical value of the data representing the operational control signals, $N_L$ is the numerical value of the data representing the control settings, and $a$ and $b$ are the numerical values of the data representing the calibration factors.

5. Apparatus as in claim 4 wherein the computing means computes the numerical value of the calibration factors $a$ and $b$ by simultaneous solution of the relationship having the form $N_D = a\, N_L + b$.

6. Apparatus as in claim 1 further including a control panel having having display means and input means mounted thereon and coupled to the memory and computing means wherein:
   the input means is manually operable for causing the computing means to increment and decrement the numerical value of the digital data representing the control settings of the analog operational funtions performed by the apparatus; and
   said display means displays the incremented or decremented value of the control settings to the user.

7. Apparatus as in claim 1 wherein said apparatus measures electronic signals.

8. Apparatus as in claim 7 wherein the computing means is remotely controllable for adjusting the digital data representing the control settings of the analog operational functions of electronic signal processing apparatus to automatically perform quantitative measurements of input signals.

9. Apparatus as in claim 7 wherein said apparatus is an oscilloscope.

10. Apparatus as in claim 9 wherein the computing means is programmable for selectively adjusting the digital data representing the control settings of the oscilloscope to automatically search for and display input signals.

11. Apparatus as in claim 10 wherein the computing means is programmable for selectively adjusting the digital data representing the control settings of the oscilloscope to automatically perform quantitative measurements of input signals.

12. Apparatus as in claim 9 wherein the computing means is remotely controllable for adjusting the digital data representing the control settings of the oscilloscope.

13. Apparatus as in claim 12 wherein the computing means is programmable for selectively adjusting the digital data representing the control settings of the oscilloscope to automatically search for and display input signals, and to automatically perform quantitative measurements of input signals.

14. Apparatus as in claim 9 wherein the computing means is programmable for computing the numerical value of digital data representing selected calibration factors of the analog operational functions of the oscilloscope.

15. Apparatus as in claim 9 wherein the computing means is remotely controllable for computing the numerical value of digital data representing selected calibration factors of the analog operational functions of the oscilloscope.

16. Apparatus as in claim 1 wherein said apparatus produces electronic signals.

17. Apparatus as in claim 16 wherein the computing means is programmable for selectively adjusting the numerical value of digital data representing control settings of the analog operational functions for automatically producing electronic signals.

18. Apparatus as in claim 1 wherein the computing means is programmable for selectively adjusting the digital data representing the control settings of the analog operational functions.

19. Apparatus as in claim 1 wherein the computing means is programmable for computing the numerical value of digital data representing selected calibration factors of the analog operational functions.

20. Apparatus as in claim 1 wherein the computing means is remotely controllable for computing the numerical value of digital data representing selected calibration factors of the analog operational functions.

21. Apparatus as in claim 1 further including display means for displaying the digital data.

22. A method for processing analog signals in electronic signal processing apparatus comprising the steps of:
   storing digital data representing control settings of analog operational functions performed by the apparatus;
   storing digital data representing calibration factors for calibrating said analog operational functions;
   computing the numerical value of digital data representing operational control signals for controlling said analog operational functions as a mathematical function of corresponding control settings and calibration factors;
   storing the digital data representing said operational control signals;
   producing operational control signals in response to the digital data representing said operational control signals; and
   applying the operational control signals to the analog operational functions associated with each of the control settings and calibration factors for processing the analog signals.

23. A method as in claim 22 wherein the digital data representing the control settings, calibration factors and operational control signals are related according to the relationship $N_D = f(N_L, N_C)$, where $N_D$ is the numerical value of the data representing the operational control signals, $N_L$ is the numerical value of the data representing the control settings, and $N_C$ is the numerical value of the data representing the calibration factors.

24. A method as in claim 23 wherein the step of computing the numerical value of the digital data representing operational control signals includes the step of computing the numerical value of $N_C$ by simultaneous solution of relationships of the form $N_D = f(N_L, N_C)$.

25. A method as in claim 23 wherein the control settings, calibration factors and operational control signals are related according to the relationship having the form $N_D = a\, N_L + b$ where $N_D$ is the numerical value of the data representing the operational control signals, $N_L$ is the numerical value of the data representing the control settings, and $a$ and $b$ are the numerical values of the data representing the calibration factors.

26. A method as in claim 25 wherein the step of computing the numerical value of the digital data representing operational control signals includes the step of computing the numerical value of the calibration factors $a$ and $b$ by simultaneous solution of the relationship of the form $N_D = a\, N_L + b$.

27. A method as in claim 22 wherein the step of storing digital data representing the control settings of the analog operational functions includes the step of displaying said digital data.

28. A method as in claim 22 wherein the electronic signal processing apparatus measures electronic signals.

29. A method as in claim 28 wherein the electronic signal processing apparatus is an oscilloscope.

30. A method as in claim 22 wherein wherein the electronic signal processing apparatus produces electronic signals.

31. A method as in claim 30 wherein the step of storing digital data representing control settings of the operational functions includes the step of adjusting the numerical value of said digital data for causing the electronic signal apparatus to automatically produce analog electronic signals.

32. A method as in claim 27 wherein the step of storing digital data representing the control settings of the analog operational functions includes the step of programmably adjusting the numerical value of the said digital data to a preselected values.

33. A method as in claim 22 wherein the step of storing the numerical value of the digital data representing the calibration factors includes the step of programmably computing the numerical value of digital data representing selected calibration factors of the analog operational functions.

34. A method as in claim 22 wherein the step of storing the numerical value of the digital data representing the calibration factors includes the step remotely controlling computation of the numerical value of digital data representing selected calibration factors of the analog operational functions.

35. A method as in claim 22 wherein the step of storing digital data representing the control settings of the analog operational functions includes the step of incrementing and decrementing the numerical value of the digital data representing said control settings.

* * * * *

UNITED STATES PATENT AND TRADEMARK OFFICE
CERTIFICATE OF CORRECTION

PATENT NO. : 4,099,240
DATED : July 4, 1978
INVENTOR(S) : France Rode, et al

It is certified that error appears in the above-identified patent and that said Letters Patent are hereby corrected as shown below:

Column 8, line 26, delete " > " and insert -- < --;

Column 9, line 19, delete " $N_L$ value and NC factors." and insert -- $N_L$ value and $N_C$ factors. --;

Column 15, line 13, delete " 27 " and insert -- 22 --.

Signed and Sealed this

Seventeenth Day of July 1979

[SEAL]

Attest:

LUTRELLE F. PARKER
Attesting Officer    Acting Commissioner of Patents and Trademarks